United States Patent [19]

Ishida et al.

[11] Patent Number: 5,766,364

[45] Date of Patent: Jun. 16, 1998

[54] PLASMA PROCESSING APPARATUS

[75] Inventors: Toshimichi Ishida, Hirakata; Yuichiro Yamada, Suita; Takahiro Takisawa, Kadoma; Hiroshi Tanabe, Yamatotakada, all of Japan

[73] Assignee: Matsushita Electric Industrial Co., Ltd., Osaka-fu, Japan

[21] Appl. No.: 893,940

[22] Filed: Jul. 15, 1997

[30] Foreign Application Priority Data

Jul. 17, 1996 [JP] Japan .................. 8-187212

[51] Int. Cl.⁶ .................................................. C23C 16/00
[52] U.S. Cl. ............................ 118/725; 118/715; 118/724
[58] Field of Search ............................... 118/715, 724, 118/725

[56] References Cited

U.S. PATENT DOCUMENTS 5,595,606  1/1997  Fujikawa ........................ 118/724
5,653,806  8/1997  van Buskirk ..................... 118/724

*Primary Examiner*—Richard Bueker
*Attorney, Agent, or Firm*—Price, Gess & Ubell

[57] ABSTRACT

Generated heat is effectively dissipated to prevent thermal deformation of a gas ejector plate in a plasma processing apparatus which is capable of processing a substrate of large scale. A temperature controlling plate 106 and heat conductor 109 are fixedly disposed on the upper electrode-cum-gas ejector plate 105 which is provided with a multiplicity of gas ejecting apertures 105a disposed at regular intervals. The heat conductor 109 is constructed to be a latticed member for effectively conducting heat from the gas ejector plate 105 to the temperature controlling plate 106, and has a plurality of gas pressure equalizing spaces 109a defined between crossing bars of the lattice for pressuring process gas to be evenly ejected through the gas ejecting apertures 105a.

7 Claims, 4 Drawing Sheets

1

PLASMA PROCESSING APPARATUS

BACKGROUND OF THE INVENTION

1. Technical Field of the Invention

The present invention relates to a plasma processing apparatus for forming a thin film on a substrate by a plasma chemical vapor deposition method, and particularly to a plasma processing apparatus for accomplishing thin film forming on larger substrates such as a glass substrate for a liquid crystal display by a plasma CVD method.

2. Description of Related Art

A conventional plasma processing apparatus for forming a thin film on a substrate by a plasma CVD method is shown in FIG. 6, in which a lower electrode 4 connected to the ground is disposed at a lower part in a chamber 1 which is equipped with a vacuum outlet 12 for making a vacuum. The lower electrode 4 incorporates a heater 3 therein, by which it is heated to be around 400° C. for heating a substrate 2 made of glass or the like placed thereon at a predetermined temperature.

An upper cover 11 is mounted on the top of the chamber 1 to support an upper electrode-cum-gas ejector plate 5 above and in parallel to the lower electrode 4, an insulator 10 being disposed between the gas ejector plate 5 and the upper cover 11. The gas ejector plate 5, which also functions as an upper electrode, is made of aluminum alloy or the like and has a plurality of evenly distributed gas ejecting apertures 5a therein.

A gas feed conduit 6 for feeding process gas is held above the gas ejector plate 5 by the insulator 10 anchored to the upper cover 11. A gas distribution plate 9 which has a multiplicity of gas distributing apertures 9a therein is mounted between the gas feed conduit 6 and the gas ejector plate 5, making a gas pressure equalizing space 9b between the gas distribution plate 9 and the gas ejector plate 5. This allows the process gas to be uniformly pressurized in the gas equalizing space 9b and ejected evenly through the gas ejecting apertures 5a of the gas ejector plate 5.

The gas feed conduit 6, the gas distribution plate 9, and the gas ejector plate 5 are connected to a high-frequency power source 8 through an impedance matching device 7.

Plasma processing is carried out in a manner described below. High-frequency electric power is applied to the gas ejector plate 5 from the high-frequency power source 8, while the process gas of $SiH_4$, $NH_3$, $N_2$, $H_2$, or the like is ejected from the gas ejector plate 5. Plasma is then generated between the gas ejector plate 5 and the grounded lower electrode 4, forming a thin film of nitride or the like on a surface of the substrate 2.

It is impossible to provide mounting bolts on a lower side of the gas ejector plate 5 where plasma is generated in the above-described prior art arrangement, since it may cause abnormal electric discharge during the generation of plasma. Also, it has such a configuration that a central part of the gas ejector plate 5 is not mechanically supported in order to form the gas pressure equalizing space 9b required for ejecting the process gas evenly.

Although the conventional apparatus is applicable to production of a thin film on a relatively small-sized substrate, there has been a need for plasma processing apparatuses being capable of producing a thin film on a substrate of large scale, as it has been desired to increase the size of substrates.

In the above described conventional apparatus, radiant heat of about 400° C. from the lower electrode 4 and heat developed during the plasma generation received by the gas ejector plate 5 can escape only from the periphery of the gas ejector plate 5. The gas ejector plate 5 of larger scale causes the heat to stay in its middle part which soars up to around 200° C. to 300° C., creating a great difference in temperature between the middle part and the periphery, as a result of which the gas ejector plate 5 is deformed to form a bulge because of different thermal expansion rates. The deformation of the gas ejector plate 5 creates a difference in distance between the lower electrode 4 and the gas ejector plate 5, which may cause unevenness of the film deposited on the substrate 1 or influence the property of the film.

BRIEF SUMMARY OF THE INVENTION

It is a primary object of the present invention to provide a plasma processing apparatus being capable of performing plasma processing on a large substrate without presenting any problems of deformation of a gas ejector plate caused by heat.

A plasma processing apparatus according to the present invention includes a pressure reduced chamber for accommodating an object to be plasma processed, a pair of opposite electrodes mounted in the chamber for ionizing process gas supplied into the chamber, a process gas supplying means and a high-frequency power source both connected to one of the electrodes, and a heater for heating the object placed on the other electrode, characterized in that it is provided with a temperature controlling member equipped with a temperature regulator, a gas ejector plate having a multiplicity of gas ejecting apertures provided therein at regular intervals and serving as one of the electrodes, and a grid-like heat conducting member placed between the temperature controlling member and the gas ejector plate for conducting heat from the gas ejector plate to the temperature controlling member, making a plurality of gas pressure equalizing spaces between crossing bars of the grid for evenly pressurizing and ejecting the process gas through the gas ejecting apertures of the gas ejector plate.

According to the plasma processing apparatus of the present invention, excessive raise in temperature and deformation of the gas plate caused thereby are prevented even with a large gas ejector plate, while allowing the process gas to be evenly ejected from the gas ejector plate, thus realizing formation of an even thin film of stable characteristics on a large substrate.

The grid-like heat conducting member may have a gas inlet disposed in the center thereof for receiving the process gas, and may be formed symmetrically about its center to make the gas pressure equalizing spaces of the same shape, in order to enhance the effect of controlling excessive heat raise, further assuring the formation of an even thin film of stable characteristics on the substrate.

DETAILED DESCRIPTION OF PREFERRED EMBODIMENTS

One embodiment of a plasma processing apparatus according to the present invention will be described referring to FIGS. 1 to 5.

Figure 1:
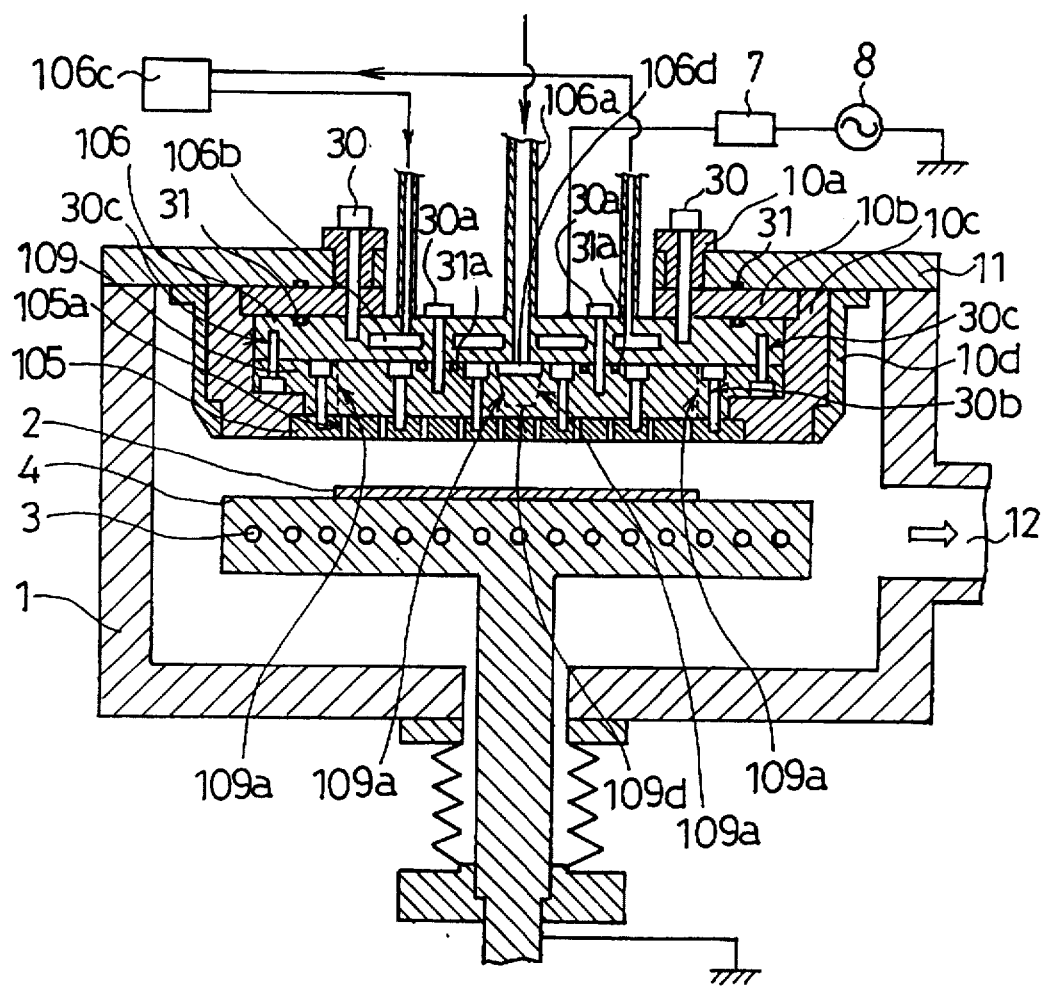
FIG. 1 is a side sectional view showing one embodiment of a plasma processing apparatus according to the present invention.
Figure 2:
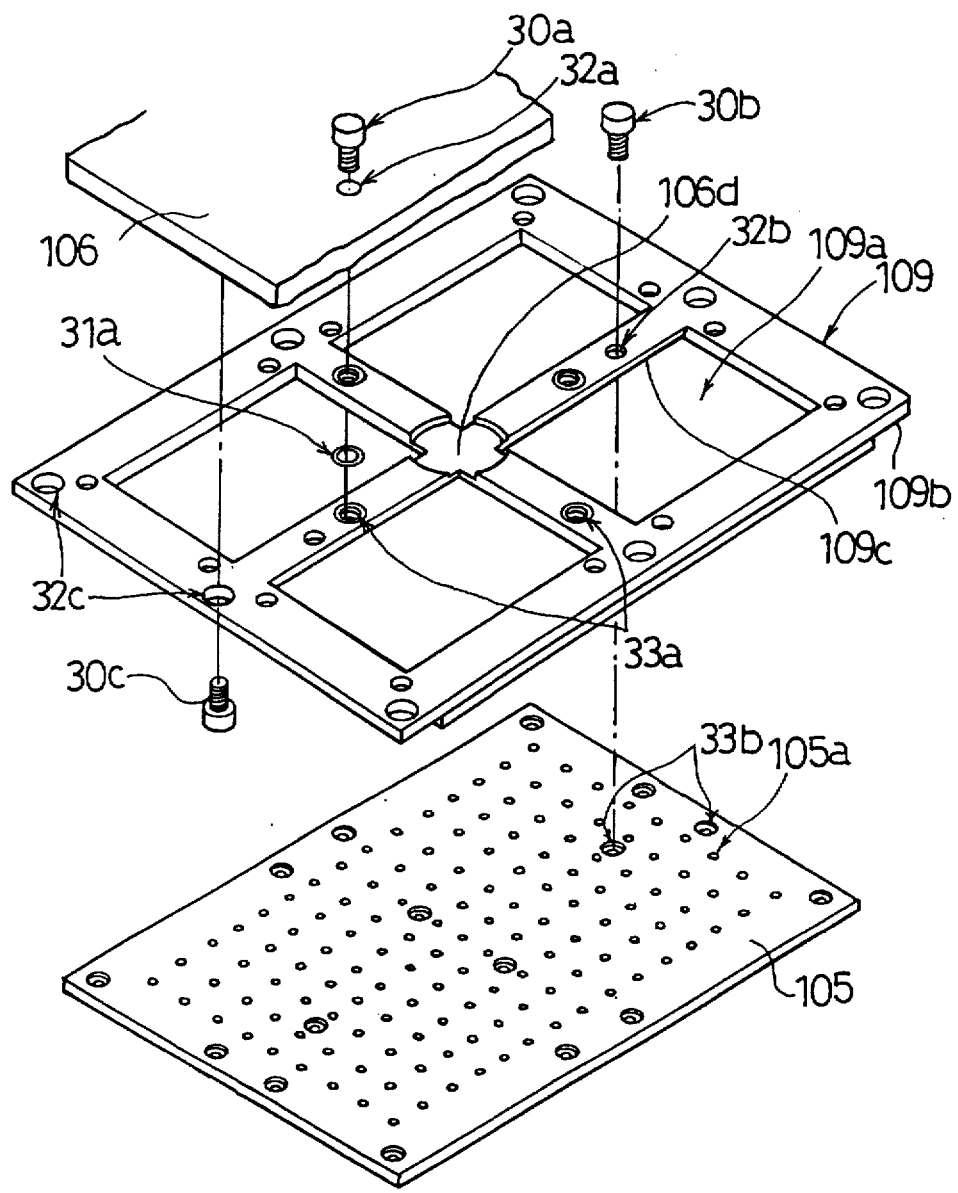
FIG. 2 is an exploded perspective view showing primary parts of one embodiment of the plasma processing apparatus according to the present invention.

Referring to FIG. 1, a lower electrode 4 made of cast aluminum alloy and connected to the ground is disposed at a lower side in a pressure reduced chamber 1 which is vacuum exhausted from a vacuum exhaustion outlet 12. A substrate 2 made of glass is placed on the lower electrode 4 which is heated by a built-in heater 3 therein at around 400° C. to heat the substrate 2 thereon at a predetermined temperature. The lower electrode 4 is driven upward and downward by a lifting means such as a cylinder (not shown).

Mounted on the top of the chamber 1 is an upper cover 11 having an opening in the center thereof. The upper cover 11 holds a temperature controlling plate 106, a heat conductor 109 of grid-like shape forming gas pressure equalizing spaces 109a in each cell defined by crossing bars of the grid, and an upper electrode-cum-gas ejector plate 105 having a multiplicity of gas ejecting apertures 105a therein by mounting bolts 30 with a group of insulators 10a, 10b, and 10c held therebetween.

The gas ejecting apertures 105a are disposed at an equal distance with each other on the gas ejector plate 105 made of aluminum alloy for evenly ejecting process gas. The gas pressure equalizing spaces 109a are required to be positioned above the gas ejector plate 105 in order to cause the process gas to be evenly blown out through the gas ejecting apertures 105a. It is also necessary to escape heat from the central part of the gas ejector plate 105 to prevent generation of a temperature difference between the central part and the periphery of the gas ejector plate 105. These requirements are satisfied by the heat conductor 109 and the temperature controlling plate 106.

Detailed constructions and mounting methods of the temperature controlling plate 106, the heat conductor 109, and the gas ejector plate 105 will be explained referring to FIGS. 1 to 5.

The temperature controlling plate 106 made of aluminum alloy shown in FIGS. 1 to 5 is fastened to the lower side of the upper cover 11 below the opening thereof, with the insulators 10a and 10b being held therebetween by the mounting bolts 30. The temperature controlling plate 106 has cooling water passages 106b, through which cooling water is circulated from a thermostatic circulating tank 106c equipped with a heater and a cooling mechanism, so as to maintain a predetermined temperature of around 80° C. The temperature controlling plate 106 has a gas feed conduit 106a in its center, from which the process gas is supplied to the gas inlet 106d disposed in the center of the heat conductor 109.

Figure 3:
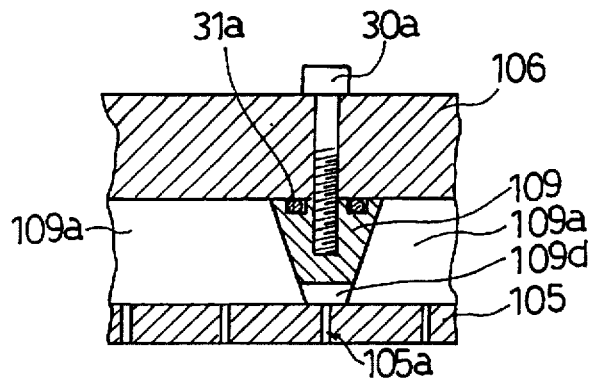
FIG. 3 is a sectional view showing primary parts of the plasma processing apparatus according to the present invention.
Figure 4:
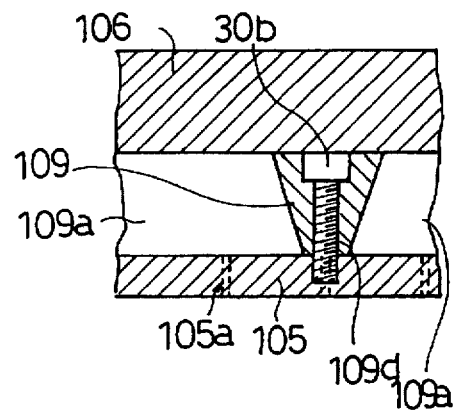
FIG. 4 is a sectional view showing primary parts of the plasma processing apparatus according to the present invention.
Figure 5:
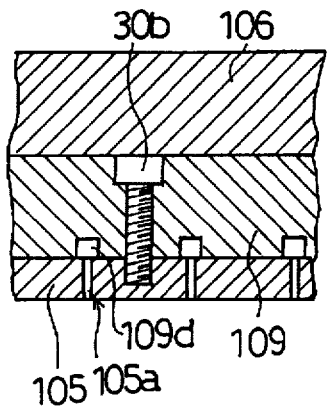
FIG. 5 is a sectional view showing primary parts of the plasma processing apparatus according to the present invention.
Figure 6:
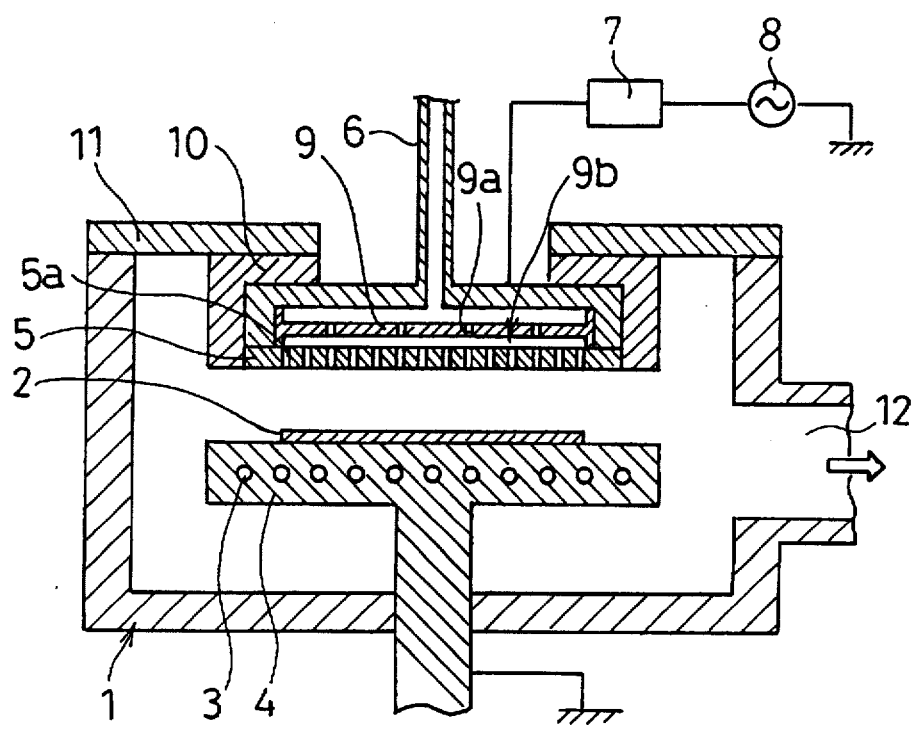
FIG. 6 is a side sectional view showing a conventional plasma processing apparatus.

The latticed heat conductor 109 made of aluminum alloy comprises a frame part 109b for transmitting heat from the periphery of the gas ejector plate 105, and crossing bars 109c for transmitting heat from the central part of the gas ejector plate 105. The spaces defined by the frame 109b and the crossing bars 109c make the gas pressure equalizing spaces 109a. The crossing bars 109c are formed symmetrically around the center of the heat conductor 109, so as to make a plurality of the gas pressure equalizing spaces 109a of the same shape. A gas inlet 106d is disposed at the center of the heat conductor 109, which is the center of symmetry for forming the grid, so that the process gas can be equally pressurized in the gas pressure equalizing spaces 109a and ejected through the gas ejecting apertures 105a. As shown in FIGS. 3 to 5, gas passages 109d are provided to the points where the crossing bars 109c of the heat conductor 109 cover the gas ejecting apertures 105a of the gas ejector plate 105, so that the gas ejecting apertures 105a can be provided evenly at regular intervals on the gas ejector plate 105.

The method of assembling the temperature controlling plate 106, the heat conductor 109, and the gas ejector plate 105 will be explained referring to FIGS. 2 to 5.

The heat conductor 109 and the gas ejector plate 105 are fastened to each other by second bolts 30b through holes 32b of the heat conductor 109 into thread holes 33b provided on the gas ejector plate 105. This allows heat generated in the gas ejector plate 105 to be dissipated not only from the periphery but also from the entire surface of the heat conductor 109. It is noted that the thread holes 33b should not extend through the gas ejector plate 105 to its lower side.

As mentioned above, the temperature controlling plate 106 is then mounted to the lower side of the upper cover 11 below the opening thereof by the mounting bolts 30, holding the insulators 10a and 10b therebetween. The chamber 1 is kept airtight by O-rings 31.

The heat conductor 109 and the gas ejector plate 105 coupled to each other by the second bolts 30b are then fastened to the temperature controlling plate 106 by first bolts 30a through holes 32a approximately in the middle of the temperature controlling plate 106 into thread holes 33a near the center of the heat conductor plate 109. The heat conductor 109 is further fixed to the temperature controlling plate 106 by third bolts 30c through holes 32c at the edge of the heat conductor 109 into thread holes (not shown) at the edge of the temperature controlling plate 106. The chamber 1 is kept airtight by second O-rings 31a. The heat generated in the gas ejector plate 105 can thus be dissipated through the heat conductor 109 to the temperature controlling plate 106.

Further, the periphery of the temperature controlling plate 106, the heat conductor 109, and the gas ejector plate 105 is secured by the insulator 10c and a holder 10d made of aluminum alloy and connected to the ground.

Consequently, the heat radiated from the lower electrode 4 of about 400° C. received by the gas ejector plate 105, together with the heat generated from the plasma processing, is effectively transmitted through the heat conductor 109 to the temperature controlling plate 106 maintained to be at around 80° C., so that the gas ejector plate 105 is kept approximately at 100° C. Deformation of the gas ejector plate 105 caused by heat can thus be prevented, allowing an even thin film of stable characteristics to be successfully deposited on the substrate of large scale.

The material constituting the primary elements of the present invention is not limited to aluminum alloy as has been described in the embodiment but may be any other appropriate material such as pure aluminum or stainless steel.

According to the plasma processing apparatus of the present invention, excessive raise in temperature and deformation of the gas plate caused thereby are prevented even with a large gas ejector plate, while allowing the process gas to be evenly ejected from the gas ejector plate, thus realizing formation of an even thin film of stable characteristics on a large substrate.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

We claim:

1. A plasma processing apparatus having a pressure reduced chamber for accommodating an object to be plasma processed, a pair of opposite electrodes mounted in the chamber for ionizing process gas supplied into the chamber, a process gas supplying means and a high-frequency power source both connected to one of the electrodes, and a heater for heating the object placed on the other electrode, comprising:

a temperature controlling member equipped with a temperature regulating means;

a gas ejector plate having a multiplicity of gas ejecting apertures provided therein at regular intervals and serving as one of the electrodes; and a heat conducting member constructed to be a latticed form and placed between the temperature controlling member and the gas ejector plate, each of a plurality of spaces defined by crossing bars constituting the heat conducting member making gas pressure equalizing spaces for pressurizing and ejecting the process gas evenly through the gas ejecting apertures of the gas ejector plate.

2. A plasma processing apparatus according to claim 1, wherein the latticed heat conducting member has a gas inlet disposed in the center thereof for receiving the process gas.

3. A plasma processing apparatus according to claim 1, wherein the latticed heat conducting member has gas passages provided therein where the crossing bars cover the gas ejecting apertures of the gas ejector plate.

4. A plasma processing apparatus according to claim 1, wherein all the gas pressure equalizing spaces have the same shape and are arranged symmetrical about the center of the heat conducting member.

5. A plasma processing apparatus for depositing a thin film on a glass substrate used in a liquid crystal display comprising:

a pressure chamber;

a lower electrode mounted in the pressure chamber and electrically grounded, the lower electrode is larger than a glass substrate used to form a component of a large liquid crystal display;

a heater for heating the glass substrate on the lower electrode to a temperature of approximately 400° C.;

a combination upper electrode assembly including a gas manifold member, gas ejector member and a heat conducting member, is mounted above the lower electrode;

means for providing a process gas to the gas manifold member to transmit the gas to the gas ejector to form a plasma between the upper and lower electrodes; and means for providing a coolant to the heat conducting member to maintain the gas ejector member at a substantially constant temperature of approximately 80° C.

6. The invention of claim 5 wherein the gas manifold member has an open latticed configuration to transmit heat from the gas ejector to the heat conducting member.

7. The invention of claim 5 wherein the heat conducting member is mounted to the pressure chamber, the gas manifold member is connected to the heat conducting member and the gas ejector is directly secured to the gas manifold member.

* * * * *